United States Patent [19]

Davis et al.

[11] E Patent Number: Re. 33,180

[45] Reissued Date of Patent: Mar. 13, 1990

[54] LIGHT WEIGHT CHASSIS AND CABINET ASSEMBLY FOR MAGNETIC TAPE RECORDER

[75] Inventors: William R. Davis; David G. Hart, both of Sarasota, Fla.

[73] Assignee: Fairchild Weston Systems, Inc., Syosset, N.Y.

[21] Appl. No.: 943,050

[22] Filed: Dec. 18, 1986

Related U.S. Patent Documents

Reissue of:

[64] Patent No.: 4,489,358
Issued: Dec. 18, 1984
Appl. No.: 423,330
Filed: Sep. 24, 1982

[51] Int. Cl.[4] ..... G11B 00/00; H02B 1/02

[52] U.S. Cl. ..... 360/137; 312/320; 361/415

[58] Field of Search ..... 360/137; 312/320; 361/415

[56] References Cited

U.S. PATENT DOCUMENTS

| | | | |
|---|---|---|---|
| 2,857,558 | 10/1958 | Fiske | 317/101 |
| 3,335,326 | 8/1967 | Bonin et al. | 317/99 |
| 3,345,540 | 10/1967 | Sutherland et al. | 317/99 |
| 3,639,809 | 2/1972 | Phlieger, Jr. | 317/117 |
| 3,676,747 | 7/1972 | Jorgensen et al. | 317/101 |
| 3,683,238 | 8/1972 | Olds et al. | 317/118 |
| 3,689,128 | 9/1972 | Andreini et al. | 312/320 |
| 3,770,889 | 11/1973 | Gutschick | 358/254 |
| 3,913,997 | 10/1975 | Puil et al. | 312/223 |
| 3,925,710 | 12/1975 | Ebert | 361/383 |
| 4,179,724 | 12/1979 | Bonhomme | 361/415 X |
| 4,227,237 | 10/1980 | Mathews et al. | 361/415 |
| 4,287,764 | 9/1981 | Staab et al. | 73/431 |

FOREIGN PATENT DOCUMENTS

| | | | |
|---|---|---|---|
| 1500800 | 11/1975 | France | 358/254 |

OTHER PUBLICATIONS

"Analog Tape Recorders", p. 145, FIG. 1, Hewlett Packard—1970 Electronics for Measurement Analysis . . .

*Primary Examiner*—John H. Wolff
*Attorney, Agent, or Firm*—Lowe, Price, LeBlanc, Becker & Shur

[57] ABSTRACT

To minimize the weight of a magnetic tape recorder chassis and cabinet assembly, a wire frame chassis (18) carrying printed circuit board guides (20) and connectors (22) is mounted to one side of a sand cast bezel (24), and polyurethane wall panels (16) are secured to the wire frame. A cabinet cover and underlying tape transport assembly are hinged to the bezel to enable pivoting away from the wire frame, exposing circuit boards for servicing. The "open air flow" characteristic of the wire frame chassis (18) helps cool critical electrical components.

14 Claims, 3 Drawing Sheets

LIGHT WEIGHT CHASSIS AND CABINET ASSEMBLY FOR MAGNETIC TAPE RECORDER

Matter enclosed in heavy brackets [ ] appears in the original patent but forms no part of this reissue specification; matter printed in italics indicates the additions made by reissue.

TECHNICAL FIELD

The present invention relates generally to electrical equipment chassis and cabinet assemblies, and more particularly, toward light weight chassis and cabinet assemblies for tape recorders or other equipment controlled by multiple printed circuit boards that must occasionally be accessed for assembly and servicing.

BACKGROUND ART

One of the most important considerations in the design of chassis and cabinet assemblies to house tape recorders or other electrical equipment is the ease with which circuitry and mechanical parts can be installed and serviced. Thus, wall panels of a cabinet must be removable to provide access to the circuit boards. The chassis and cabinet must be light enough to be easily carried, yet rigid to prevent deformation of the structural parts and provide protection of circuitry and mechanical parts.

To reduce the internal operating temperature of the recorder or other equipment, the chassis structure should be relatively open, with numerous air flow paths for convection cooling of parts.

Finally, the assembly must be easy to construct and relatively inexpensive, to avoid adding substantially to the cost of the equipment.

DISCLOSURE OF INVENTION

An object of the invention, therefore, is to provide a chassis and cabinet assembly for tape recorders or other electrical equipment that is light weight, serviceable and sturdy, while having an "open air flow" design to provide efficient heat removal from critical components.

A chassis and cabinet assembly, in accordance with the invention, comprises a rigid, cast bezel to which is mounted a light weight, wire skeleton carrying printed circuit board guides and connectors. Light weight, polyphenylene oxide foam wall panels are secured to the frame by sandwiching the frame between the panels and mounting brackets and anchoring the brackets to the bezel. A tape transport is hinged to the bezel to enable the transport to be pivoted outwardly from the frame to expose the printed circuit boards and other interior components. Of particular significance, the bezel provides rigidity to the wire frame and wall panels while also supporting the relatively massive tape transport mechanism. The open air flow structure provided by the wire frame chassis helps cool the printed circuit board assemblies and transport.

Still other objects and advantages of the present invention will become readily apparent to those skilled in this art from the following detailed description, wherein we have shown and described only the preferred embodiment of the invention, simply by way of illustration of the best mode contemplated by use of carrying out our invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
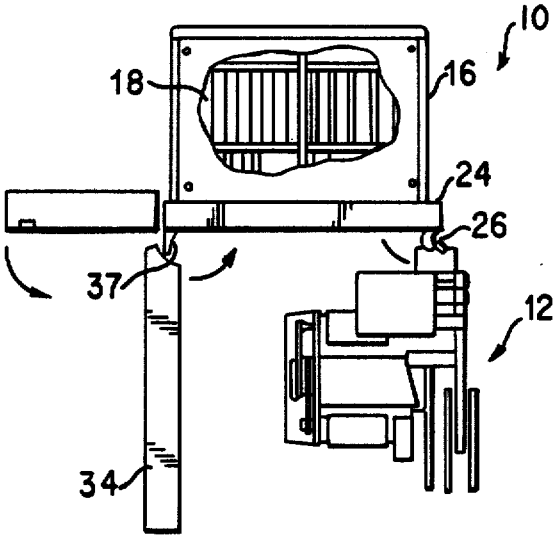
FIG. 1 is a top view of a tape recorder incorporating a chassis and cabinet assembly in accordance with the principles of the present invention.
Figure 2:
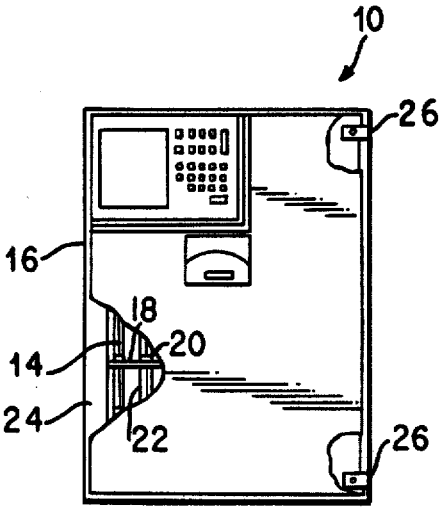
FIG. 2 is a front view of the assembly.
Figure 3:
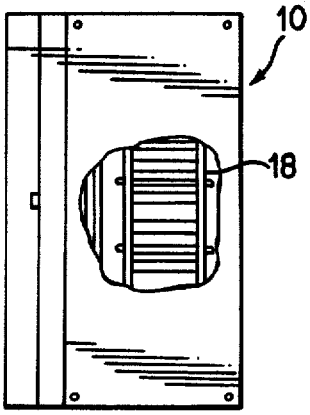
FIG. 3 is a side view of the assembly.

With reference to FIGS. 1–3, a chassis and cabinet assembly 10, in accordance with the invention, houses a magnetic tape recorder having a magnetic tape transport mechanism 12 and signal processing circuitry on printed circuit boards, such as boards 14, within cabinet walls 16. The printed circuit boards 14 within the cabinet walls 16 are mounted on a printed circuit board rack 18 formed of a light weight, wire skeleton or frame, preferably formed of 0.187 wire, supporting printed circuit board guides 20. Printed circuit board connectors 22 are soldered to a "mother" board circuit 36 (see FIG. 6) which provides substantially all the electrical interconnections among the printed circuit boards 14. The wire frame 18 is secured to one side of an aluminum, sand cast bezel 24; to the opposite side of the bezel, through hinges 26, is mounted the tape transport mechanism 12.

The bezel 24, which may be rectangular to accommodate tape recording equipment or other electrical equipment of the type shown in FIG. 2, is rigid, thereby providing rigidity to the wire frame 18 which would otherwise have a tendency to twist and become deformed. This is particularly important since any deformation of the frame 18 would tend to cause warping of printed circuit boards or to create difficulty in assembling and disassembling the boards with respect to the frame. The bezel 24 also provides the sole supporting structure for the relatively massive tape transport mechanism 12 which, although normally seated within the cabinet 16, is hinged directly to the bezel.

Figure 4:
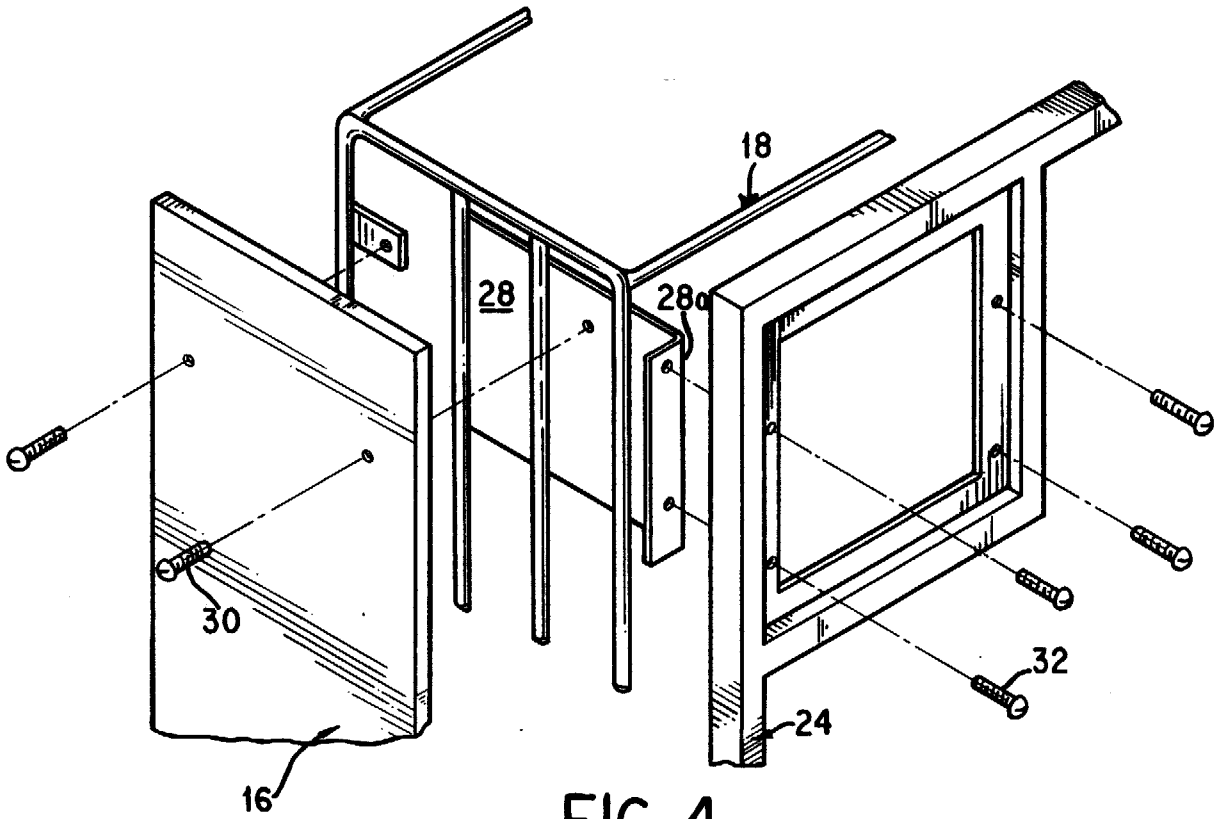
FIG. 4 is an exploded view of a portion of the assembly, showing the interconnection of a wall panel, the wire frame chassis and the bezel.

With reference to FIG. 4, each panel 16, which is prefeably formed of a light weight, plastic foam material, such as polyphenylene oxide, is mounted to frame 18 by an angle bracket 28. The frame 18 is sandwiched between the bracket 28 and panel 16, and the assembly is secured by bolts 30. The "ear" **28*a* of bracket 28 is anchored to front bezel 24 using another set of bolts 32. In other words, the wire frame 18 and polyphenylene oxide panels 16 are secured to bracket 28 whereas the bracket 28 carrying the panel and wire frame is secured to the bezel. This technique provides convenient assembly and disassembly of the chassis and cabinet while applying the full load of the frame as well as any circuit board components which it carries and the side wall panels to only the rigid bezel 24**.

Figure 5:
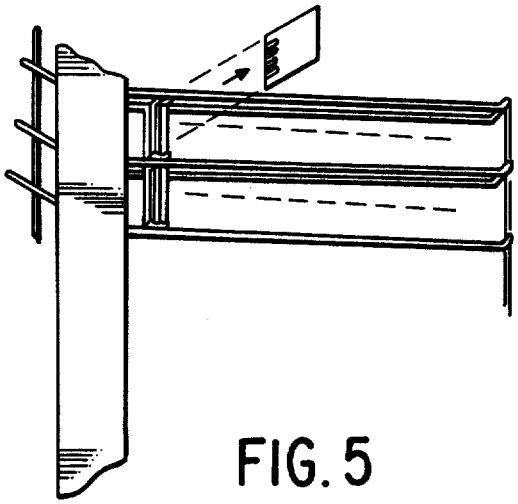
FIG. 5 is a partial view of the wire frame chassis carrying a number of printed circuit board guides.
Figure 6:
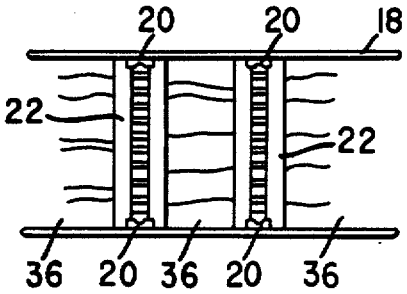
FIG. 6 is a top view of the wire frame chassis more clearly illustrating the printed circuit board guides and connectors on the "mother" board.

The magnetic tape transport 12 is pivoted to bezel 24 at hinge 26 to enable the transport to be pivoted on the bezel away from the wire frame chassis 18 to expose printed circuit boards for assembly or repair. To access the boards 14, a main cabinet cover 34, also preferably formed of polyphenylene oxide, is swung open about hinge 37. Hinge 37 is preferably a "quick-disconnect" type to enable the cover 34 to be completely removed from bezel 24, is desired. The tape transport mechanism 12 is then pivoted outwardly about its hinge 26 to expose the circuit boards and other internal components. The boards are removed by pulling from the corresponding connectors and guides, as shown in FIG. 5. A view of the connectors and guides following removal of circuit boards is shown in FIG. 6.

Of particular importance, the open air structure of the chassis and cabinet assembly provided by wire frame 18 for supporting printed circuit boards 14 and wall panels 16 maximizes air flow within the cabinet and thereby helps remove heat from critical electrical or electronic components. This "open" structure also improves accessibility to circuits and wiring within the cabinet for servicing. Because all tape recorder functions are segregated on individual circuit boards, using a "mother board" circuit layout, inter-board wiring is minimized. Preferably, the wiring between circuit boards is, as shown in FIG. 6, provided by printed circuits such as circuit boards 36, extending between connectors 22.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

We claim:

1. In a magnetic tape recorder, a light weight chassis and cabinet assembly, comprising a rigid bezel;

a circuit boards support means, including a wire frame carrying opposed pairs of circuit board guides and electrical connector means positioned to be connected to circuit boards supported between said guide pairs;

first means for supporting said wire frame to said bezel such that said bezel prevents deformation of said wire frame[, said circuit board guides being approximately perpendicular to a plane of said bezel];

a magnetic tape transport mechanism; and second means for pivotably supporting said tape transport mechanism to one end of said bezel to enable said mechanism to be pivoted outwardly from said frame.

2. The assembly of claim 1, including a plurality of wall panels, and second means for supporting said wall panels to said wire frame.

3. The assembly of claim 1, wherein said second supporting means includes at least one hinge secured to a side of said bezel opposite said wire frame.

4. The assembly of claim 2, wherein said wall panels are formed of a plastic structural foam material.

5. The assembly of claim 4, wherein said material is polyphenylene oxide.

6. The assembly of claim 1, including a cabinet cover and hinge means for pivotably mounting said cabinet cover to an opposite end of said bezel.

7. The assembly of claim 2, including angle bracket means, said first supporting means including means for securing said wall panels to one portion of said angle bracket means and said second supporting means including means for securing said bezel to a second portion of said angle bracket means perpendicular to said first portion.

8. A light weight chassis and cabinet assembly for electrical equipment, comprising:

a rigid bezel;

circuit board support means, including a wire frame carrying opposed pairs of circuit board guides and electrical connector means positioned to be connected to circuit boards supported between said guide pairs;

at least one wall panel;

a mounting bracket;

means for supporting said wire frame to said panel means by sandwiching said wire frame between said wall panel and said bracket; and means for supporting said wire frame and wall panel to said bezel by securing said mounting bracket to said bezel.

9. The assembly of claim 8, wherein said wall panel is formed of a plastic structure foam material.

10. The assembly of claim 9, wherein said material is polyphenylene oxide.

11. The assembly of claim 8, including a carrier for supporting electrical equipment and hinge means for supporting said carrier to one of said bezel to enable said carrier to pivot on said bezel outwardly from said wire frame.

12. The assembly of claim 11, including a cabinet cover and hinge means for supporting said cover to an opposite end of said bezel.

13. The assembly of claim 6 or claim 11, wherein said cover is releasably secured to said hinge means to enable removal of said cover.

*14. The assembly of claim 1, wherein said circuit board guides are approximately perpendicular to a plane of said bezel.*

* * * * *